United States Patent
Han et al.

(10) Patent No.: US 8,368,424 B1
(45) Date of Patent: Feb. 5, 2013

(54) PROGRAMMABLE LOGIC DEVICE WAKEUP USING A GENERAL PURPOSE INPUT/OUTPUT PORT

(75) Inventors: Wei Han, Beaverton, OR (US); Zheng Chen, Upper Macungie, PA (US); Warren Juenemann, Cornelius, OR (US); Eric Lee, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 37 days.

(21) Appl. No.: 13/038,259

(22) Filed: Mar. 1, 2011

(51) Int. Cl.
*H03K 19/173* (2006.01)

(52) U.S. Cl. .......................................... 326/38

(58) Field of Classification Search .............. 326/37–47, 326/101
See application file for complete search history.

(56) References Cited

U.S. PATENT DOCUMENTS

| | | | |
|---|---|---|---|
| 5,138,198 A | 8/1992 | Shen et al. | |
| 7,376,037 B1 * | 5/2008 | Law et al. | 365/226 |
| 7,463,060 B1 * | 12/2008 | Whitten et al. | 326/40 |
| 7,558,143 B1 | 7/2009 | Law et al. | |
| 7,560,953 B1 * | 7/2009 | Singh et al. | 326/38 |
| 7,714,609 B1 | 5/2010 | Liu | |
| 7,724,029 B1 | 5/2010 | Singh et al. | |
| 7,919,979 B1 * | 4/2011 | Mason et al. | 326/41 |
| 8,040,151 B2 * | 10/2011 | Speers | 326/38 |
| 2006/0132302 A1 * | 6/2006 | Stilp | 340/539.22 |
| 2010/0156457 A1 * | 6/2010 | Greene et al. | 326/39 |
| 2010/0156458 A1 * | 6/2010 | Speers | 326/39 |
| 2010/0286527 A1 * | 11/2010 | Cannon et al. | 600/459 |

\* cited by examiner

*Primary Examiner* — Shawki Ismail
*Assistant Examiner* — Thienvu V Tran
(74) *Attorney, Agent, or Firm* — Haynes and Boone, LLP

(57) ABSTRACT

In one embodiment, a programmable logic device such as an FPGA includes a programmable fabric adapted to operate normally and in a sleep mode, and a general purpose input/output port (I/O). The I/O port is adapted to function in conventional fashion during normal operation of the programmable fabric and as a wakeup control port during the sleep mode.

9 Claims, 3 Drawing Sheets

PROGRAMMABLE LOGIC DEVICE WAKEUP USING A GENERAL PURPOSE INPUT/OUTPUT PORT

TECHNICAL FIELD

The present invention relates generally to programmable logic devices and, more particularly, to a programmable logic device having general purpose input ports configurable to wakeup the device.

BACKGROUND

Programmable logic devices such as field programmable gate arrays (FPGAs) allow a designer to avoid the expense of constructing an ASIC to implement a desired function. Rather than design an ASIC, a user may configure an off-the-shelf programmable logic device such as an FPGA to implement the desired function. An FPGA architecture is shown in FIG. 1. FPGA 100 includes a programmable fabric 105 that includes an array of programmable logic blocks 110 (also referred to in the art as programmable logic cells, configurable logic blocks, programmable logic elements, or programmable logic regions). Fabric 105 also includes a programmable interconnect 120 for programmably coupling signals into and out of logic blocks 110. Each logic block 110 includes one or more look-up tables (LUTs) that are configured by a user to implement a desired logical function. A characteristic of field programmable gate arrays is that logic blocks 110 are "fine-grain" logic blocks in that each logic block 110 may implement at best a few primitive logic functions. In other words, each logic block 110 may be configured to perform the functions of just a few logic gates. In contrast, other types of programmable logic devices such as complex programmable logic devices (CPLDs) have "coarse-grain" logic blocks that may be configured to perform the functions of many logic gates.

In general, a collection of fine-grain logic block such as logic blocks 110 may be used more efficiently to implement a user's design than would a comparable collection of coarse-grained logic blocks. Thus, FPGAs have become the dominant product in the programmable logic device industry. Despite their popularity, however, problems remain with respect to traditional FPGA design. For example, the fine-granularity of logic blocks 110 places great demands on routing structure 120 used to couple signals to and from logic blocks 110. Because each logic block 110 can implement just a few logic gates, a typical logical function that a user desires to implement requires the configuration of a fairly large number of logic blocks 110. Routing structure 120 must be quite complex to allow the necessary routing of signals from one logic block 110 to another across this number of logic blocks 110. Numerous junctions in routing structure 120 are thus configured with multiplexers or other switching structures to allow one conductor in routing structure 120 to couple to another conductor as desired. As a result, a configured routing structure 120 consumes a substantial amount of power, regardless of whether FPGA 100 is idle or operating.

Routing structure 120 is not the only power-hungry feature on FPGA 100. In addition, flip-flops or other storage devices (not illustrated) within each logic block 110 are clocked synchronously with each other. Routing a clock signal to each logic block 110 thus also consumes power, whether or not FPGA 100 is idle or actively performing logic. As clock rates are increased in modern FPGAs, this clock-based consumption of power is exacerbated. Indeed, it may be shown that nearly 90% of an FPGA's power consumption is attributable to the interconnect configuration and the clock distribution.

Only about 5% of the total power budget is used within logic blocks 110 to perform the desired logical function. It will be appreciated, however, that the consumption of power by logic blocks 110 becomes more appreciable as transistor dimensions are pushed into the deep submicron region. Regardless of the component density, the standby or idle power consumption of an FPGA is substantial. As transistor dimensions are continually decreased, power dissipation increases.

Should an FPGA be powered from a line power supply, this idle power consumption is quite cheap to supply. However, in a handheld or mobile application, a conventional FPGA will demand too much power, limiting battery charge run time to unacceptably short periods. Thus, FPGAs have been provided with various sleep and standby modes to reduce idle power consumption. In a sleep mode, the programmable fabric is powered down such that it is unavailable to wake up the device. While it is common to use a configuration port command to place an FPGA into sleep mode (or into total power down), once the FPGA is in sleep mode the corresponding port logic may be non-functional such that a configuration port command is ineffective to exit a sleep or standby mode. For this reason, it is conventional for an FPGA to wakeup from the use of a dedicated wakeup input/output (I/O) pin. This is problematic, however, in that an FPGA has a limited number or I/O pins available for use. A dedicated wakeup pin is thus limiting the number of general purpose pins available on an FPGA. Accordingly, there is a need in the art for improved FPGA wakeup implementations.

SUMMARY

In one embodiment of the invention, a programmable logic device includes a programmable fabric including programmable logic resources; a power manager circuit adapted to drive the programmable fabric into a sleep mode from normal operation and to wake up the programmable fabric from the sleep mode into normal operation, the power manager circuit responsive to an assertion of an internal wakeup signal; and a general purpose input/output port (I/O) adapted to function in conventional fashion during normal operation of the programmable fabric and as a wakeup control port during the sleep mode, the general purpose I/O port adapted to assert the internal wakeup signal in response to an external wakeup signal and an internal wakeup enable signal.

In another embodiment of the invention, a field programmable gate array (FPGA), includes a programmable fabric adapted to operate normally and in a sleep mode; and a general purpose input/output port (I/O) adapted to function in conventional fashion during normal operation of the programmable fabric and as a wakeup control port during the sleep mode, the general purpose I/O port adapted to assert an internal wakeup signal for the programmable fabric in response to an external wakeup signal and an internal wakeup enable signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In one embodiment of the invention, a programmable logic device includes a general purpose input/output (I/O) port that also functions as a wakeup control port. Referring again to FIG. 1, FPGA 100 includes a general purpose I/O port 130. For example, port 130 may be a Serial Peripheral Interface (SPI) port or an Inter-Integrated Circuit (I²C) port. As known in the integrated circuit arts, SPI and I²C are conventional serial bus protocols for serial data communication between integrated circuits. Thus, during normal operation of FPGA 100, port 130 is used to input and output user data to FPGA 100 in a conventional fashion. However, as discussed further herein, port 130 is modified to respond to an externally-provided wakeup signal if programmable fabric 105 is in a sleep mode. As used herein, "sleep mode" will refer to any low-power mode of operation in which fabric 105 is unavailable to respond to user inputs. Because fabric 105 is unavailable to assist in wakeup from a sleep mode, FPGA 100 includes a dedicated power manager circuit 140 that responds to port 130 to wakeup fabric 105 such that FPGA 100 resumes normal operation. It will be appreciated that power manager circuits operable to wakeup the programmable fabric for a programmable logic device are known in the art—for example, the MachXO family of programmable logic devices manufactured by Lattice Semiconductor Corporation® include a power manager circuit. However, power manager circuit 140 differs from such conventional power manager circuits in that power manager circuit 140 responds to port 130 instead of a dedicated wakeup pin as discussed earlier.

Figure 2:
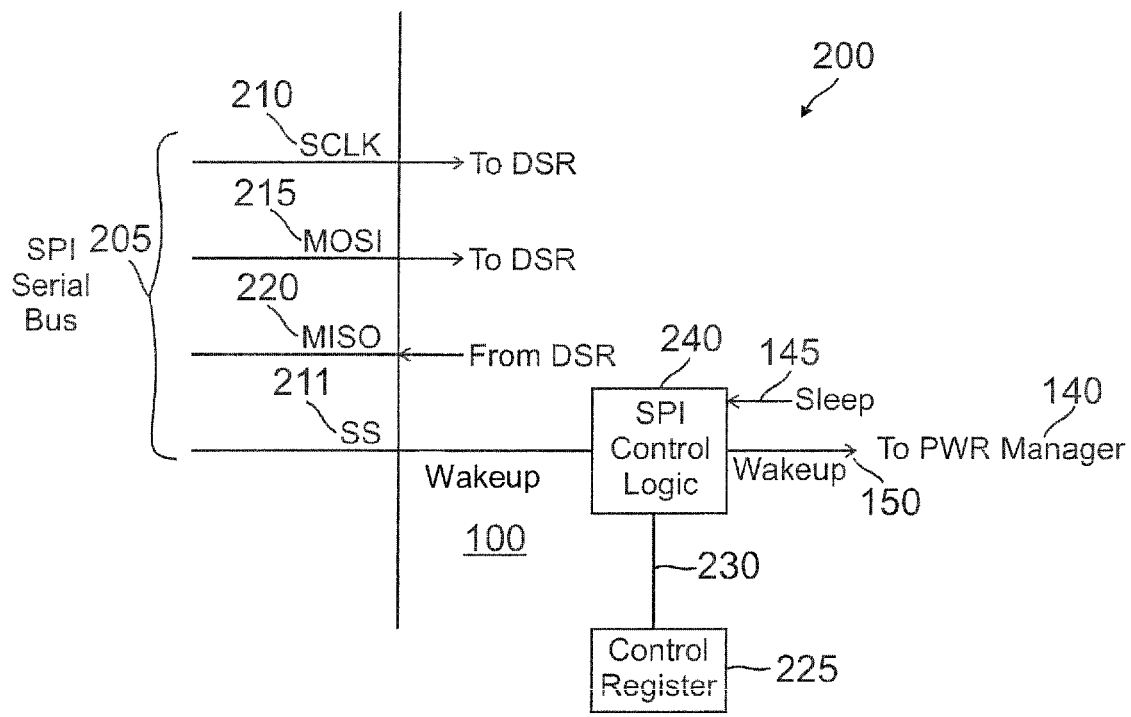
FIG. 2 is a block diagram of an SPI port modified to serve as the wakeup control port within the FPGA of FIG. 1.

Modification of port 130 may be better understood with reference to SPI port 200 of FIG. 2. As known in the SPI arts, port 200 couples to an external four-wire SPI serial bus 205. FPGA 100 may thus operate as a slave SPI device to an external master device (not illustrated) that is driving serial bus 205 according to an SPI clock (SCLK) signal 210. To write data to or read data from SPI port 200, the master device asserts a slave select (SS) signal 211, which is typically an active low signal. As used herein, a signal is said to be asserted when it is true, regardless of whether that assertion is active high or active low. After asserting SS signal 211 (pulling SS signal 211 low), the master device may drive a bit of serial data at each cycle of SCLK signal 210 into a data shift register ((DSR) not illustrated for drawing clarity) within FPGA 100 using a master-output-slave-input (MOSI) data signal 215. Similarly, the master device may receive a bit of serial data at each cycle of SCLK signal 210 from the DSR as a master-input-slave-output (MISO) data signal 220.

Because of the four independent signals carried on SPI serial bus 205, FPGA 100 would thus include four separate pins or pads to couple to bus 205. During normal operation, these four pins would operate in a conventional SPI fashion as described above. But what is not conventional about port 200 is that it will act as a wakeup control port in response to an appropriate externally provided signal such as the assertion of SS signal 211 while fabric 105 is in sleep mode.

SPI port 200 includes an SPI wakeup control logic circuit 240 and a control register 225 to assist in the assertion of an internal wakeup control signal 150. Control register 225 configurable to register a wakeup enable signal 230 that is asserted if a user wants port 200 to respond to an externally provided wakeup signal. For example, wakeup enable signal 230 may be part of the configuration bitstream used to configure FPGA 100. A user would thus make a decision prior to configuring FPGA 100 as to whether the wakeup enable signal 230 should be asserted. If so, one or more wakeup enable bits for control register 225 are added to the configuration bitstream. Alternatively, fabric 105 (FIG. 1) itself could be configured to assert or de-assert wakeup enable signal 230 according to some user-defined event during operation. SPI wakeup control logic circuit 240 is configured to respond to wakeup enable signal 230 by examining whether wakeup enable signal 230 is true during a sleep mode of fabric 105. Referring again to FIG. 1, power manager 140 is operable to assert a sleep signal 145 while it drives fabric 105 into a sleep mode. Thus, wakeup control logic circuit 240 may detect whether fabric 105 is in a sleep mode by determining whether sleep signal 145 is asserted. SPI wakeup control logic circuit 240 will thus assert wakeup signal 150 if SS signal 211, sleep signal 145, and wakeup enable signal 230 are all asserted.

Figure 3:
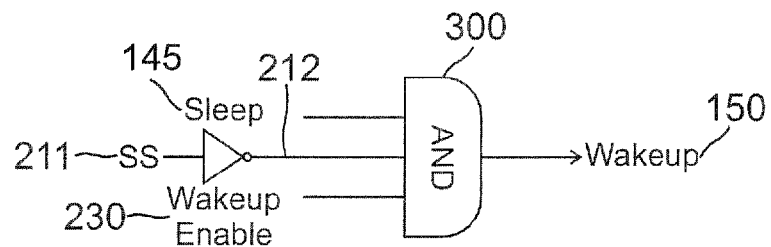
FIG. 3 is a block diagram of a logic circuit within the SPI port of FIG. 2.

Referring now to FIG. 3, SPI wakeup control logic 240 may comprise a 3-input AND gate 300 that asserts wakeup signal 150 in response to determining whether an inverted version 212 of SS signal 211, sleep signal 145, and wakeup enable 230 are all driven high (assuming that sleep signal 145 and wakeup enable 230 are active high signals). Because any internal clocks of FPGA 100 may be inactive during sleep mode, AND gate 300 may be independent of (and thus asynchronous to) any such internal clocks.

Figure 1:
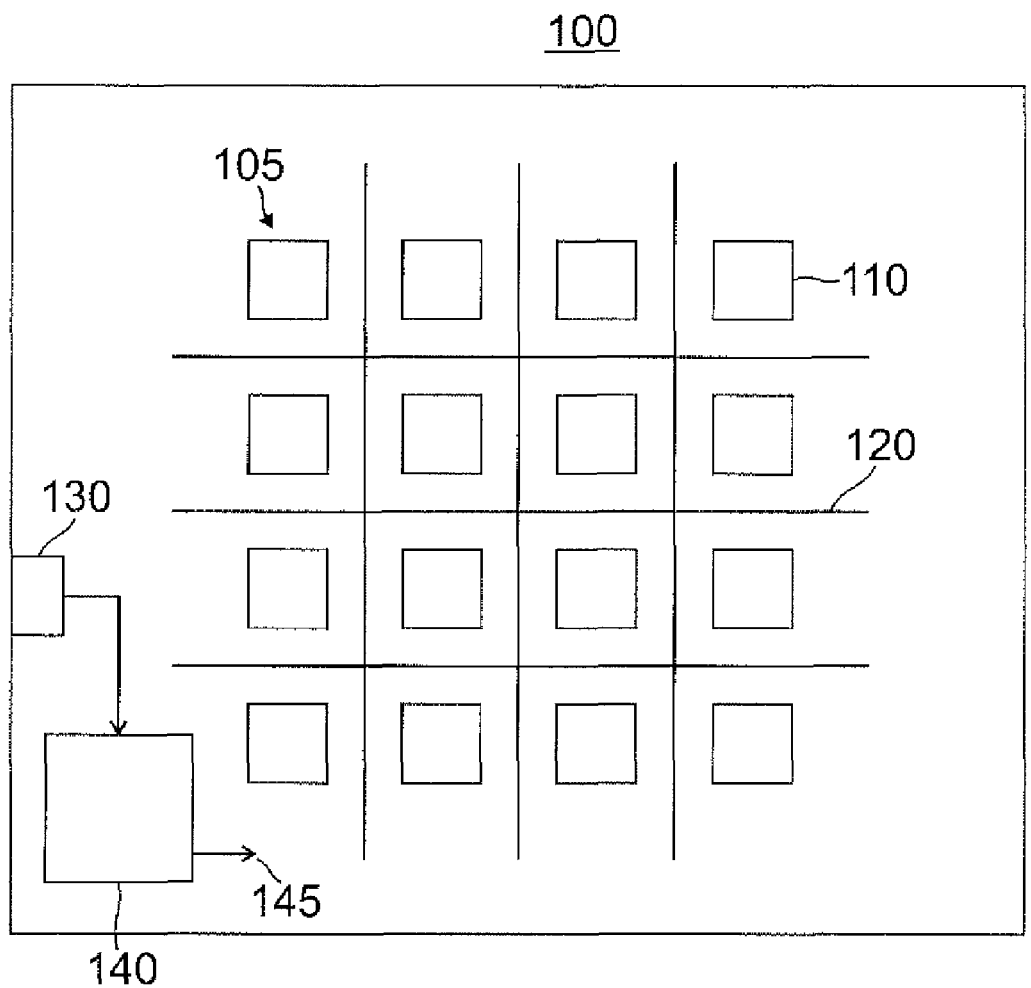
FIG. 1 is a block diagram of a field programmable gate array (FPGA) device including a general purpose input/output port adapted to serve as a wakeup port.
Figure 4:
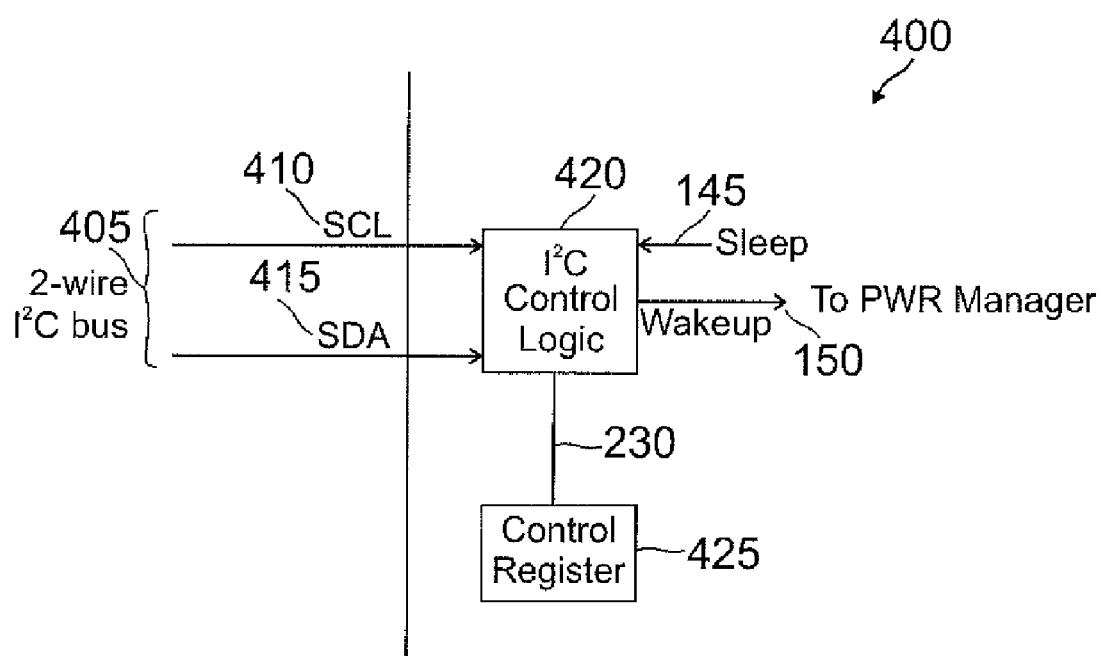
FIG. 4 is a block diagram of an I²C port modified to serve as the wakeup control port within the FPGA of FIG. 1.

Although discussed above with regard to SPI port 200, an FPGA general purpose I/O port such as an I²C port 400 may be modified analogously as shown in FIG. 4. I²C port 400 couples to an external two-wire I²C bus 405. As is conventional in the I²C arts, bus 405 carries a serial data (SDA) signal 415 and a serial clock (SCL) signal 410. Port 400 would thus have two corresponding pins or pads to receive these signals. A master device selects a slave I²C device such as FPGA 100 by first pulling SDA signal 415 low while SCL signal 410 is maintained high. The master device would then drive the appropriate seven-bit address for the slave device one bit at a time as SDA signal 415 responsive to cycles of SCL clock signal 410. Port 400 thus includes an I²C control logic circuit 420 that recognizes its I²C address to indicate that FPGA 100 has been selected by the master device. During normal operation, port 400 would then receive SDA signal 415 (if being written to) or drive signal SDA 415 (if writing out to the master device). Such operation is conventional for the I²C protocol. But to accommodate the dual-mode purpose of port 400, I²C control logic circuit 420 is modified to determine whether it has received its address from the master device when sleep mode signal 145 and wakeup enable signal 230 are asserted. In such a case, the receipt of the I²C address acts as an externally provided wakeup signal to drive control logic circuit 420 to assert internal wakeup signal 150 to the power manager 140 (FIG. 1). Wakeup enable signal 230 may be registered in a control register 425 analogously as discussed with regard to FIG. 2. As discussed analogously with regard to SPI port 200, I²C port 400 may be configured to be independent of any internal clocks since such internal clocks may be inoperative in the sleep mode.

The wakeup mode configuration of a general-purpose input port described and shown herein may be implemented in numerous alternative embodiments. For example, although described with regard to FPGA embodiments, the same or analogous wakeup ports could be implemented in complex programmable logic devices (CPLDs). Accordingly, the above-described embodiment of the present invention is but one example of many possible embodiments. It will thus be apparent to those skilled in the art that various changes and modifications may be made to what has been disclosed without departing from this invention. The appended claims encompass all such changes and modifications as fall within the true spirit and scope of this invention.

We claim:

1. A programmable logic device, comprising:
a programmable fabric;
a power manager circuit adapted to wake up the programmable fabric from a sleep mode, the power manager circuit responsive to an assertion of an internal wakeup signal;
a general purpose input/output (I/O) port;
I/O port control logic coupled to the power manager circuit; and
a control register coupled to the I/O port control logic and adapted to store a wakeup enable bit for asserting a wakeup enable signal,
wherein the I/O port control logic is adapted to assert the internal wakeup signal in response to a sleep signal received from the power manager circuit while the programmable fabric is in the sleep mode, the wakeup enable signal received from the control register, and an external wakeup signal received from the general purpose I/O port.

2. The programmable logic device of claim 1, wherein the programmable logic device is a field programmable gate array (FPGA).

3. The programmable logic device of claim 1, wherein the general purpose I/O port is a Serial Peripheral Interface (SPI) port, and the SPI port is adapted to receive the external wakeup signal on a wire of an external four-wire SPI bus.

4. The programmable logic device of claim 1, wherein the general purpose I/O port is an Inter-Integrated Circuit (I²C) port, and the I²C port is adapted to receive the external wakeup signal on a wire of an external two-wire I²C bus.

5. The programmable logic device of claim 1, wherein the I/O port control logic comprises an AND gate having at least three inputs for receiving the sleep signal, the wakeup enable signal, and the external wakeup signal, and an output for asserting the internal wakeup signal.

6. A programmable logic device, comprising:
a programmable fabric;
a power manager circuit adapted to wake up the programmable fabric from a sleep mode, the power manager circuit responsive to an assertion of an internal wakeup signal;
a Serial Peripheral Interface (SPI) port adapted to receive signals from an external four-wire SPI bus, the SPI port including SPI control logic coupled to the power manager circuit; and
a control register coupled to the SPI control logic and adapted to store a wakeup enable bit for asserting a wakeup enable signal,
wherein the SPI control logic is adapted to assert the internal wakeup signal in response to a sleep signal received from the power manager circuit while the programmable fabric is in the sleep mode, the wakeup enable signal received from the control register, and an external wakeup signal received from a wire of the external four-wire SPI bus.

7. The programmable logic device of claim 6, wherein the SPI control logic comprises an AND gate having at least three inputs for receiving the sleep signal, the wakeup enable signal, and the external wakeup signal, and an output for asserting the internal wakeup signal.

8. A programmable logic device, comprising:
a programmable fabric;
a power manager circuit adapted to wake up the programmable fabric from a sleep mode, the power manager circuit responsive to an assertion of an internal wakeup signal;
an Inter-Integrated Circuit (I²C) port adapted to receive signals from a wire of an external two-wire I²C bus, the I²C port including I²C control logic coupled to the power manager circuit; and
a control register coupled to the I²C control logic and adapted to store a wakeup enable bit for asserting a wakeup enable signal,
wherein the I²C control logic is adapted to assert the internal wakeup signal in response to a sleep signal received from the power manager circuit while the programmable fabric is in the sleep mode, the wakeup enable signal received from the control register, and an external wakeup signal received from a wire of the external two-wire I²C bus.

9. The programmable logic device of claim 8, wherein the I²C control logic comprises an AND gate having at least three inputs for receiving the sleep signal, the wakeup enable signal, and the external wakeup signal, and an output for asserting the internal wakeup signal.

* * * * *